United States Patent
Dahmen et al.

(10) Patent No.: US 6,660,328 B1
(45) Date of Patent: Dec. 9, 2003

(54) POWDER PRECURSOR DELIVERY SYSTEM FOR CHEMICAL VAPOR DEPOSITION

(75) Inventors: Klaus-Herman M. Dahmen, Tallahassee, FL (US); Ilya S. Tchouprakov, Tallahassee, FL (US)

(73) Assignee: Florida State University Research Foundation, Tallahassee, FL (US)

( * ) Notice: Subject to any disclaimer, the term of this patent is extended or adjusted under 35 U.S.C. 154(b) by 214 days.

(21) Appl. No.: 09/824,458

(22) Filed: Apr. 2, 2001

Related U.S. Application Data
(60) Provisional application No. 60/193,752, filed on Mar. 31, 2000.

(51) Int. Cl.[7] .............................................. C23C 16/00
(52) U.S. Cl. .................... 427/248.1; 118/726; 118/386; 118/387
(58) Field of Search .......................... 118/726; 392/386, 392/387; 427/248.1, 255.6

(56) References Cited

U.S. PATENT DOCUMENTS

| | | | | | |
|---|---|---|---|---|---|
| 5,447,569 A | * | 9/1995 | Hiskes et al. | ................ | 118/726 |
| 5,820,678 A | * | 10/1998 | Hubert et al. | ................ | 118/690 |
| 5,989,305 A | * | 11/1999 | Ohsaki et al. | ................. | 75/304 |
| 6,072,939 A | * | 6/2000 | Atwell | ........................ | 392/386 |

* cited by examiner

Primary Examiner—Richard Bueker
(74) Attorney, Agent, or Firm—Peter Loffler

(57) ABSTRACT

A precursor delivery system introduces a multicomponent solid precursor into an evaporator during chemical vapor deposition. The system uses a container having an open bottom with the precursor being placed into the container along with a plurality of beads that do not react with the precursor. The beads, coated with the precursor, exit the container by being transported within the groove of a roller that is rotatably disposed proximate the open bottom of the container and drop out of the groove and into the evaporator with the beads thereby introducing the precursor into the evaporator. A screen is disposed within the evaporator for capturing and retrieving the beads.

25 Claims, 6 Drawing Sheets

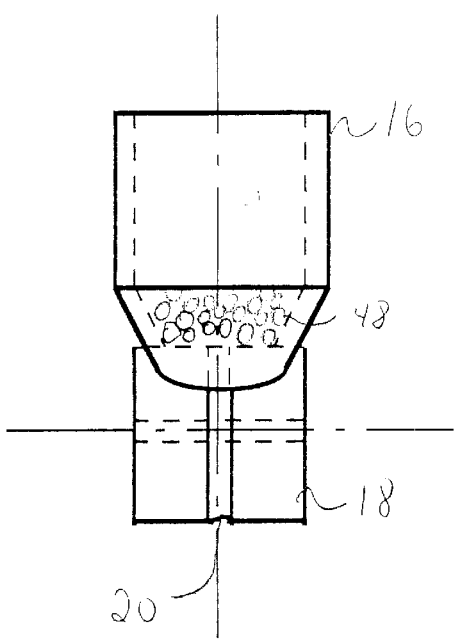
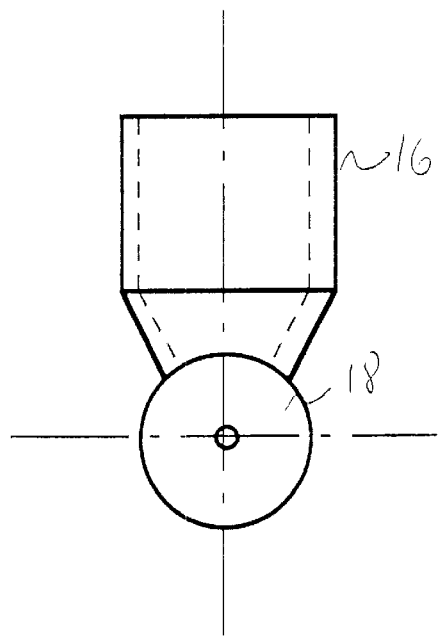
Fig. 2
Fig. 3

POWDER PRECURSOR DELIVERY SYSTEM FOR CHEMICAL VAPOR DEPOSITION

This application claims the benefit of U.S. provisional patent application No. 60/193,752 filed on Mar. 31, 2000.

BACKGROUND OF THE INVENTION

1. Field of the Invention

The present invention relates to a delivery system for delivering vapors of solid state precursors into a chemical vapor deposition reactor for thin film deposition.

2. Background of the Prior Art

Chemical vapor deposition has emerged as an important technique for thin film deposition in contemporary microelectronics and other areas. A large variety of materials can be obtained by this method including pure metal films, semiconductors, and dielectric. Although chemical vapor deposition of semiconductors and metals has been investigated for quite some time, only recently has chemical vapor deposition been studied for the formation of different oxide materials. Research into high temperature super conducting thin films has resulted in the application of chemical vapor deposition methods for the production of different ferroelectric, magnetoresistant, thermoelectric, and other electrical, magnetic, and optical materials.

In the past, precursor delivery in chemical vapor deposition did not pose problems. Liquid or even gaseous compounds like $SiH_4$, $AsH_3$ or $Al(CH_3)_3$ could be used in the deposition of a variety of semiconductors and metals. Even solid precursors such as $CBr_4$, which is used as a p-type dopant in the growth of GaAs layers, is sufficiently stable to be evaporated from a container having a constant high temperature.

However, many new materials require less volatile and frequently less stable precursors for their deposition. For example, BaO is a common component of high temperature superconducting, ferroelectric, and other thin film oxide materials $[Ba(dpm)_2]$ (dpm=dipivaloymethane) and its derivatives are the most common compounds used to introduce Ba into the films of such materials. Unfortunately, this complex evaporates only at about 250 degrees Celsius and is prone to oligomerization during heating, which decreases its vapor pressure.

Liquid precursors are convenient for chemical vapor deposition as they allow the use of a bubbler for their evaporation at temperatures at and around room temperature. This provides a constant precursor vapor pressure during the deposition. However, for some applications, precursor compounds are not known, while for other applications, the compounds are very difficult to synthesize and frequently tend to be unstable as well as air and moisture sensitive.

Therefore, many manufactures use solid precursors for the chemical vapor deposition process. For the deposition of multicomponent materials, several precursors are needed, typically one volatile compound for each component, with each compound being evaporated from a separate container. The use of multiple containers results in a large number of process parameters (temperature and flow of carrier gas for each container) which considerably complicates the control and understanding of the overall deposition process.

Therefore, a device is needed that will simplify the overall chemical vapor deposition process by evaporating all precursors together. Many solutions have been proposed. One such method dissolves all of the necessary precursors in a suitable solvent with the solution being introduced into the hot zone of an evaporator and evaporated along with the precursors. A micropump or an ultrasonic nebulizer with an inert carrier gas can be used for delivery of the solution into the evaporator. While this method has produced successful result, it has certain disadvantages. The use of the solvent raises the possibility of film contamination from carbon resulting from the decomposed solvent which contamination is highly unfavorable in electronic applications. Additionally, the use of a micropump or nebulizer increases the costs of the process and raises the possibility of nonreproducability of the properties of the film.

Another method evaporates all precursors simultaneously by introducing them as a mixture of solid compounds. Unfortunately, particles of many precursors are apt to stick together requiring a special feeder for the introduction of the precursor powder into the evaporator. One such special feeder achieves a continues precursor supply by providing a capillary having a slit along the slide. A mixture of the precursors fills the capillary which is then slowly moved into the hot zone of the evaporator wherein the mixture evaporates. This feeder proves problematic when used with a large mass of precursors, with precursors which melt before evaporation, such as $Ba(dpm)_2$, and with mixtures of precursors having substantially different vapor pressures. Another type of solid precursor feeder uses the flash-evaporation technique wherein a mixture of precursors is introduced into the hot zone in small portions. Each portion of mixture must evaporate completely before the next portion is introduced. While such a device can achieve desirable results, the device tends to be complicated and costly.

Therefore, there is a need in the art for a precursor delivery system capable of delivering a powder precursor into an evaporator, which system overcomes the above-stated problems in the art. Such a system, which must be relatively simple in design and construction and be relatively inexpensive to manufacture and operate, must be able to deliver most types and mixtures of powder precursors into the evaporator. The system must minimize the potential for contamination of the film being produced and must allow for a high degree of reproducibility of the properties of the film being produced.

SUMMARY OF THE INVENTION

The powder precursor delivery system for chemical vapor deposition of the present inventions addresses the aforementioned needs in the art. The system, which is relatively simple in design and construction and is relatively inexpensive to manufacture and operate, is able to deliver most types and mixtures of powder precursors into the evaporator. The system minimizes the potential for contamination of the film being produced and allows for a high degree of reproducibility of the properties of the film being produced.

The powder precursor delivery system of the present invention is comprised of a housing having an open first top and an open first bottom. A container having a second open top and a second open bottom is disposed within the housing while a roller having a nonstick outer surface and a circumferential groove, is rotatably disposed within the housing and positioned such that a portion of the outer surface faces the second bottom of the container. A precursor is placed into the container as is a plurality of beads wherein the precursor coats the beads. The beads exit the container by being transported within the groove of the roller as the roller is rotated and eventually dropping out of the groove by the force of gravity. The beads are made from an inert material that does not react with the precursor such as stainless steel. The precursor is placed into the container in either powder or crystal form. A motor is operatively connected to the roller for rotating the roller. An evaporator having a open third top attached to the first bottom of the housing and a third bottom is located below the container. A first inlet tube is attached to the evaporator for introducing a first gas into the evaporator. A first screen is disposed within the evaporator while a second screen is disposed within the evaporator downstream of the first screen. An outlet tube extends between the third bottom of the evaporator and a reactor for fluid flow connecting the evaporator with the reactor. A second inlet tube is attached to the outlet tube for introducing a second gas into the outlet tube. A substrate holder is disposed within the reactor while a thermocouple is attached to the holder.

BRIEF DESCRIPTION OF THE DRAWINGS

FIG. 2 is a front elevation view of the container and roller.

FIG. 3 is a side elevation view of FIG. 2.

Similar reference numerals refer to similar parts throughout the several views of the drawings.

DESCRIPTION OF THE PREFERRED EMBODIMENT

Figure 1:
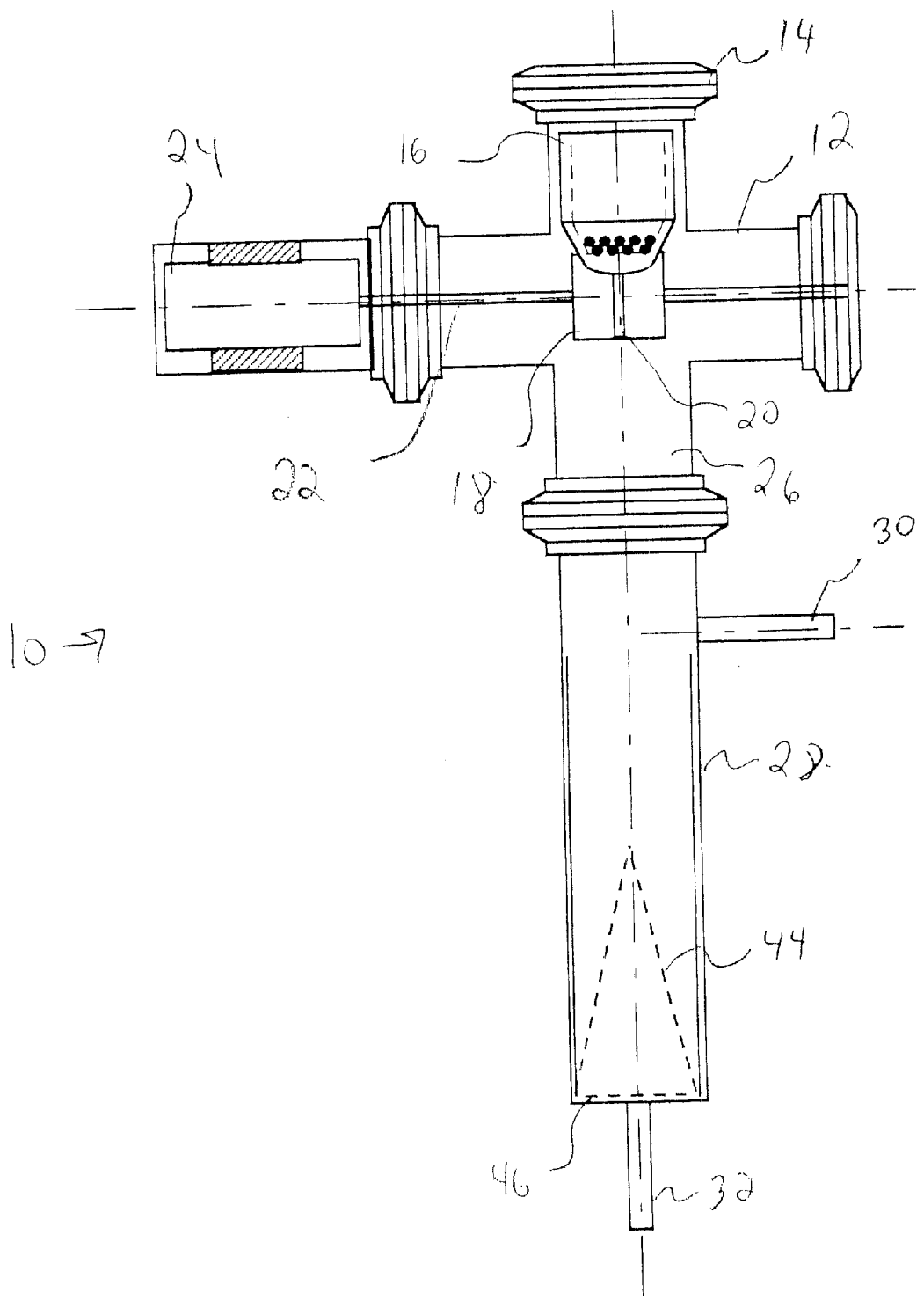
FIG. 1 is a side elevation view of the powder precursor delivery system for chemical vapor deposition of the present invention.
Figure 4:
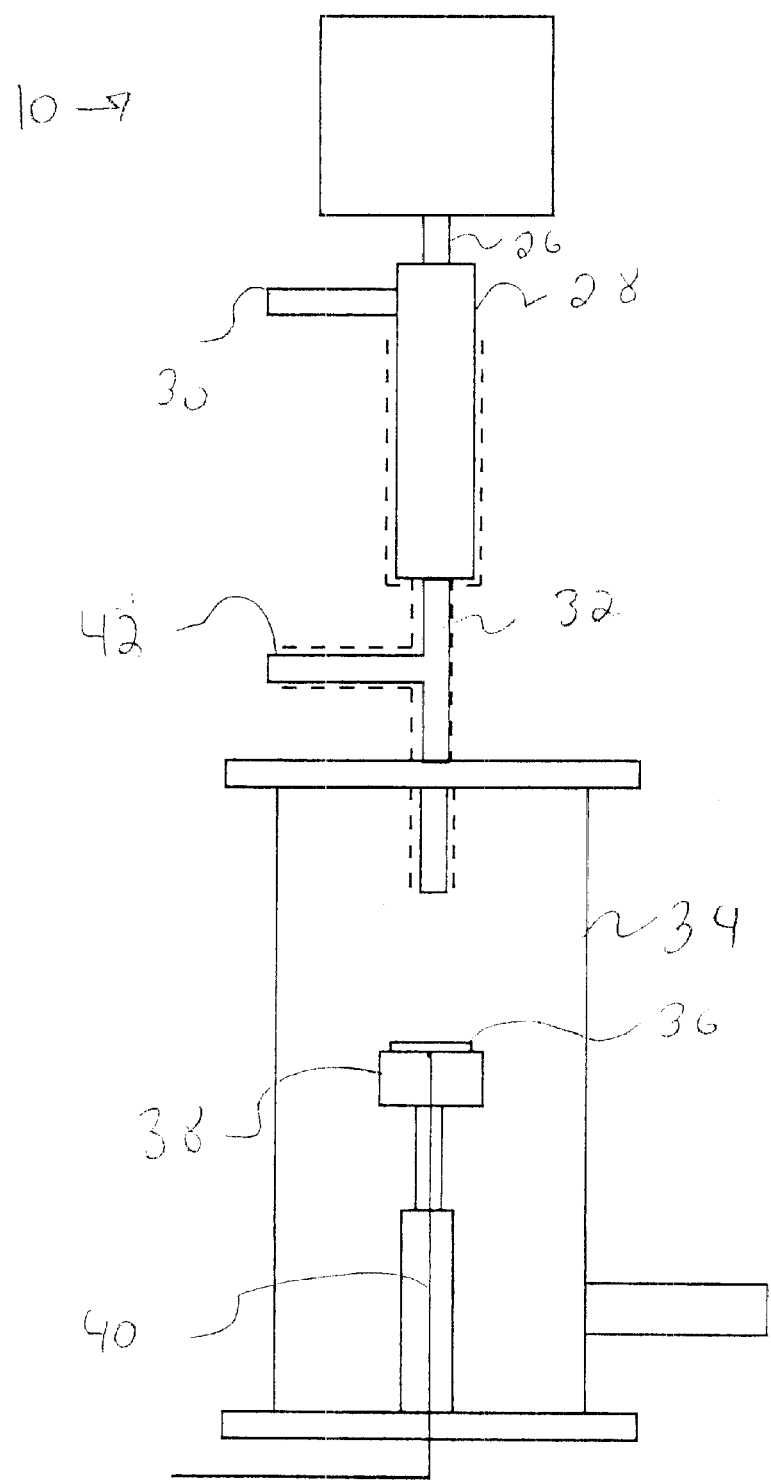
FIG. 4 is a side elevation view of the powder precursor delivery system for chemical vapor deposition within a chemical vapor deposition system.

Referring now to the drawings, it is seen that the powder precursor delivery system for chemical vapor deposition, generally denoted by reference numeral 10, is comprised of a housing 12 having an open top and an open bottom to which a cap 14 or lid can be removably attached. A container 16 having an open bottom is disposed within the housing 12. A roller 18 having a Teflon (or similar nonstick substance) outer surface and a groove 20 and having a shaft 22 passing through the roller 18, is rotatably mounted underneath the open bottom of the housing 12. A motor 24 is attached to the housing 12 and the shaft 22 is operatively connected to the motor 24. The motor 24 is electrically connected to an appropriate power source (not illustrated).

The open bottom of the housing 12 is connected, via a tube 26, to an evaporator 28 of any appropriate design, the evaporator 28 being a stainless steel foil tube member having an inlet tube 30 proximate the evaporator's top and an outlet tube 32 proximate the evaporator's bottom, the outlet tube 32 being connected to a reactor 34 of any appropriate design and having a substrate 36 mountable therein on a holder 38 to which a thermocouple 40 is attached, the outlet tube 32 itself having an inlet tube 42. A generally cone-shaped stainless steel screen 44 is located within the evaporator 28 proximate the bottom. A second stainless steel screen 46 is located within the evaporator 28 downstream of the first screen 44.

In order to use the powder precursor delivery system for chemical vapor deposition 10 of the present invention, a desired precursor is obtained and reduced to either a powder or a small crystal form. Small beads 48, which are made from any inert material that does not react with the precursor or the precursor vapor (such as 1 mm beads of stainless steel for example), are mixed with the precursor in order to dilute the precursor. The mixture is placed into the container 16 within the housing 12 and the motor 24 is activated. The activation of the motor 24 causes rotation of the shaft 22 which in turn causes rotation of the roller 18. As the roller 18 is dimensioned and positioned relative to the container 16 so that the precursor-coated beads 48 can escape from the bottom of the container 16 only by way of the groove 20, the rotation of the roller 18 causes the groove 20 to pick up the beads 48 from within the container 16 and transport them along the groove 20 until the beads 48 drop off of the groove 20 and fall into the evaporator 28 wherein the precursor is fast evaporated from the surface of the beads 48. The approximate precursor supply rate is about 1 mg per minute although this can be varied by changing the motor 24 rotation speed. The precursor vapor travels into the reactor 34 wherein it is deposited on the substrate 36 in the usual way. The first screen 44 captures the beads 48 from where the beads 48 can be retrieved after the deposition process while any other stray particles within the evaporator 28 are captured by the second screen 46 which can be cleaned or replaced as needed. Desired gas is introduced into the evaporator via its inlet tube 30 in usual fashion while desired gas is introduced into the precursor vapor via the lower inlet tube 42.

In order to test the flash-evaporation feeder of the present invention, several experiments were conducted. The evaporator 28 was heated to a temperature high enough for fast evaporation of all precursors tested. The outlet tube 32 between the evaporator 28 and reactor 34 was heated to a temperature that was 10 degrees Celsius higher than the temperature of the evaporator in order to prevent condensation. Hydrogen (H$_2$) and helium (He) of UHP/ZERO grade were used without further purification, the helium being introduced through the upper inlet tube 30 and the hydrogen being introduced through the lower inlet tube 42. The flow of each gas was controlled by a mass-flow controller with an accuracy rate of about plus/minus 1 sccm. The substrate holder 38 is heated resistively and the substrates 36 were attached to the holder 38 by a silver paste. The temperature of the substrates 36 was controlled by the thermocouple with an accuracy of about plus/minus 2 degrees Celsius. The pressure within the system was controlled with an accuracy of about plus/minus 1 mbar.

Figure 5:
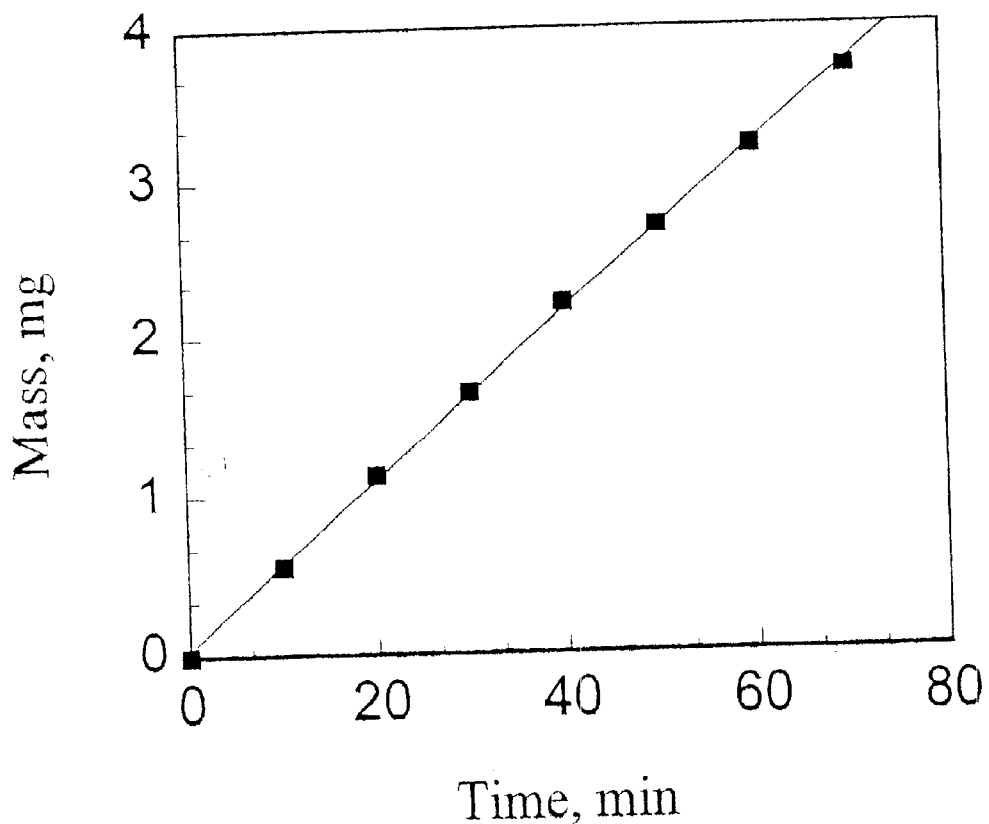
FIG. 5 is a graph illustrating the condensation rate of Ba(dpm)2 on a cold substrate holder as a function of time.

The evaporation of [Ba(dpm)$_2$] (dpm=dipivaloylmethane) followed by condensation on a cold substrate holder was tested. [Ba(dpm)$_2$] was provided and the temperature of the evaporator was about 250 degrees Celsius, while the substrate holder was at room temperature. Helium carrier gas flow was set at 50 sccm. A powder of the compound was introduced into the container and was delivered to the evaporator at a steady rate. The amount of the compound that condensed on the cold substrate holder was measured and plotted as a function of time and is illustrated in FIG. 5. As seen, the condensation rate is stable over the period of 70 minutes. No residue or decomposition products were found on the walls of the evaporator or the surface of the beads.

The powder precursor delivery system for chemical vapor deposition 10 was tested for preparations of Cu—Co binary films, such films consisting of ultrafine magnetic cobalt particles embedded in a nonmagnetic copper matrix posses giant magnetoresistance (GMR) properties. In order to deposit these films, depositions of the individual components Cu and Co were studied.

Figure 6:
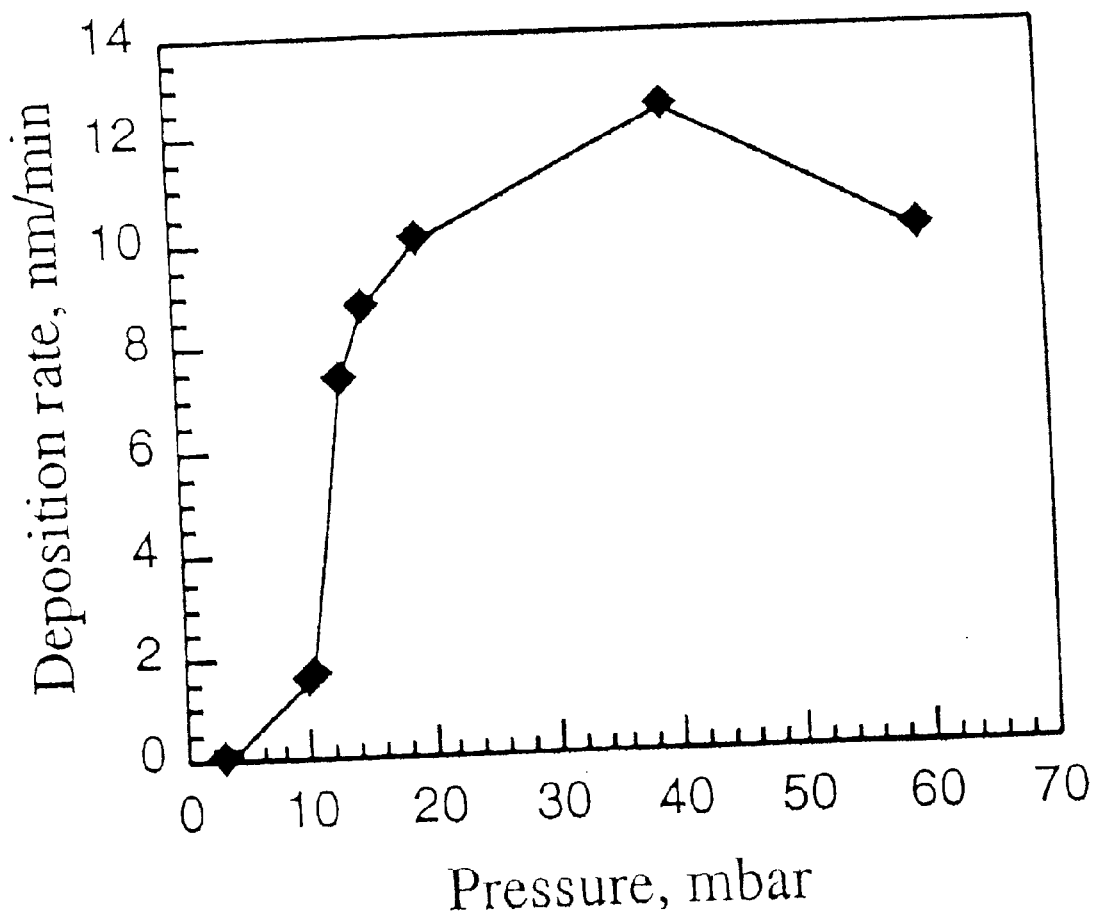
FIG. 6 is a graph illustrating the influence of pressure on the copper deposition rate.

Copper films were obtained from $Cu(dpm)_2$ (dpm= dipivloylmethanate) precursor. The temperature of the evaporator was held at about 150 degrees Celsius, while hydrogen or helium was used as the carrier gas with a flow rate of about 160 sccm. Film deposition was studied in the temperature range of about 300 to about 500 degrees Celsius and a pressure range of about 1 to about 60 mbar. The deposition rate as a function of pressure is illustrated in FIG. 6 wherein it is noted that Cu film cannot be deposited at pressures below about 5 mbar in hydrogen and/or helium flow. A pressure of about 20 mbar can be considered optimal for the deposition of Cu films at about 400 degrees Celsius.

Figure 7:
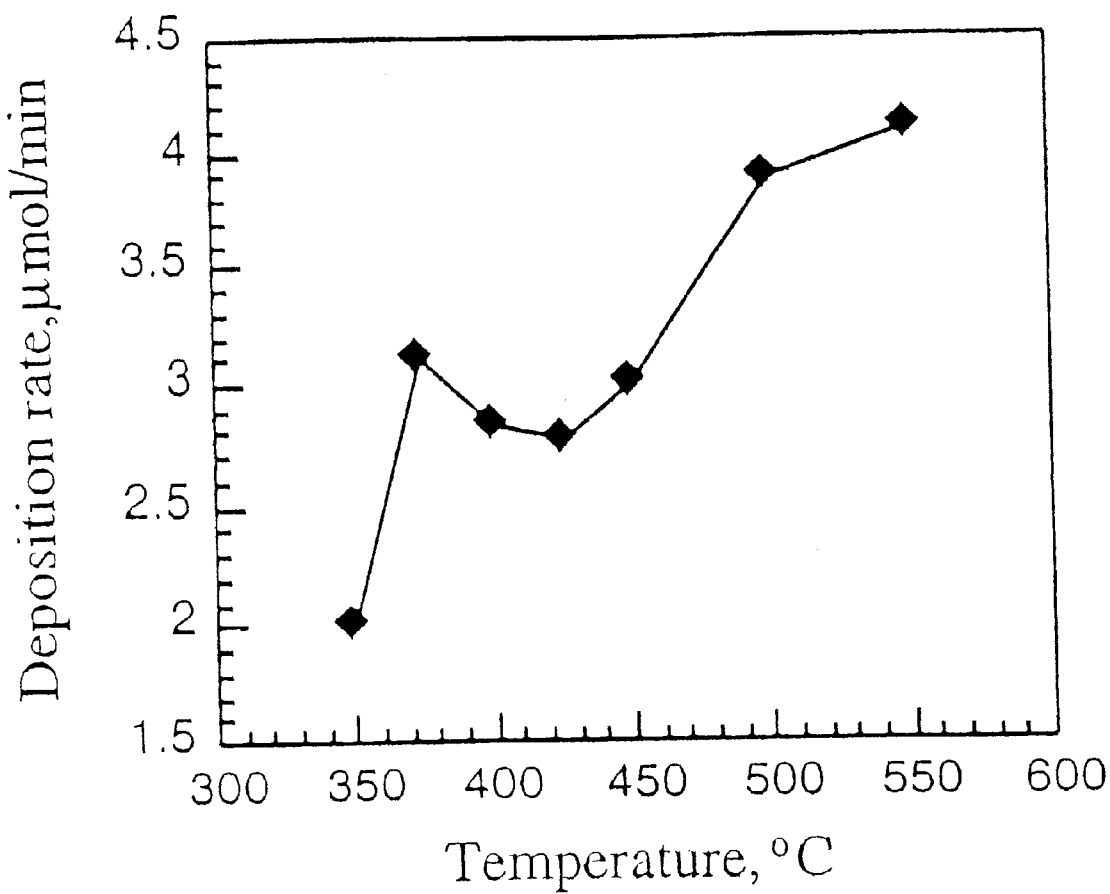
FIG. 7 is a graph illustrating the temperature dependence of the cobalt deposition rate for Co(aai)$_2$.

Cobalt films were deposited using $Co(aai)_2$ (aai= acetylacetoniminate) as a precursor. The evaporator 28 was set to a temperature of about 150 degrees Celsius and the hydrogen flow rate was about 160 sccm. Film growth was studied in the temperature range of about 350 to about 500 degrees Celsius. FIG. 7 illustrates the Cobalt deposition rate as a function of temperature. The dependence appears to differ from the classical Arrhenius temperature dependence which could be the result of catalytic influence of the deposition metal Co on the precursor decomposition reaction. Composition of the resulting Co films was studied by X-ray Photoelectron Spectroscopy (XPS). The addition of hydrogen was found to decrease the carbon content from about 15 to about 4 at. %., while the concentration of oxygen in the films remained as high as 13%. Cobalt grain size, according to SEM, was only about 20 nm.

Binary films of copper-cobalt heterogeneous alloy were prepared from a mixture of $Cu(dpm)_2$ and $Co(aai)_2$ precursors. Powders of the compounds were mixed, beads 48 were added, and the mixture was loaded into the container 16. Pressure in the system was maintained at about 20 mbar, which is required for the Cu deposition process. The temperature of the evaporator 28 was about 150 degrees Celsius, the hydrogen flow rate was about 160 sccm, and the deposition temperature was about 400 degrees Celsius. The Cu:Co precursor mixture of 3:1 atomic ratio results in films consisting of about 63.7 at. % of Cu and about 36.3 at. % of Co according to XPS. Metal Cu and Co phases were detected in the films by X-ray Diffractory (XRD). Intensity of the Co reflections was low and the peaks were broad, which can be considered as an indication of the small size of the Co grains. Only big grains with a diameter of about 200 nm were seen on SEM microphotographs, and these can be assigned to copper.

The Co precursor containing only Co—N bonds was also tested in the last setup. The cobalt salt of 3,5-dimethylpyrozolylborate, $Co([3,5\text{-}MePz]_2BH_2)_2$, can be sublimed at sufficiently low temperatures (about 180 degrees Celsius) to be used as a precursor in a chemical vapor deposition process. The high thermal stability of the compound does not allow it to be used for the deposition of cobalt films. Even at temperatures of about 600 degrees Celsius, vapors of this compound do not decompose on a dielectric or on a conducting surface. However, a mixture of $Cu(dmp)_2$ and $Co([3,5\text{-}MePz]_2BH_2)_2$ at 20 mbar give a film containing both Cu and Co. The Cu:Co precursor mixture of 1:4 atomic ratio resulted in a film composition of 36 at. % of Cu and 64 at. % Cu according to XPS. Metal Cu and Co phases are found by XRD in this film.

While the invention has been particularly shown and described with reference to an embodiment thereof, it will be appreciated by those skilled in the art that various changes in form and detail may be made without departing from the spirit and scope of the invention.

We claim:

1. A precursor delivery system comprising:
    a housing having an open first top and an open first bottom;
    a container having a second open top and a second open bottom and disposed within the housing; and
    a roller having a nonstick outer surface and a circumferential groove, the roller rotatably disposed within the housing and positioned such that a portion of the outer surface faces the second bottom of the container.

2. The precursor delivery system as in claim 1 further comprising a plurality of beads disposed within the container such that each of the plurality of beads is capable of exiting the container by being transported within the groove of the roller as the roller is rotated.

3. The precursor delivery system as in claim 2 wherein the beads are made from stainless steel.

4. The precursor delivery system as in claim 2 wherein the beads are coated with a precursor and are made from an inert material that does not react with the precursor.

5. The precursor delivery system as in claim 3 wherein the precursor is in either powder or crystal form.

6. The precursor delivery system as in claim 1 further comprising a motor operatively connected to the roller for rotating the roller.

7. The precursor delivery system as in claim 1 further comprising an evaporator having a open third top attached to the first bottom of the housing and a third bottom.

8. The precursor delivery system as in claim 7 further comprising a first inlet tube attached to the evaporator for introducing a first gas into the evaporator.

9. The precursor delivery system as in claim 7 further comprising a first screen disposed within the evaporator.

10. The precursor delivery system as in claim 9 further comprising a second screen disposed within the evaporator downstream of the first screen.

11. The precursor delivery system as in claim 7 further comprising:
    a reactor; and
    an outlet tube extending between the third bottom of the evaporator and the reactor for fluid flow connecting the evaporator with the reactor.

12. The precursor delivery system as in claim 11 further comprising a second inlet tube attached to the outlet tube for introducing a second gas into the outlet tube.

13. The precursor delivery system as in claim 11 further comprising:
    a substrate holder disposed within the reactor; and
    a thermocouple attached to the holder.

14. A method of delivering a precursor into an evaporating chamber comprising the steps of:
    providing a housing having an open first top and an open first bottom;
    providing a container having a second open top and a second open bottom and disposing the container within the housing;
    providing a roller having a nonstick outer surface and a circumferential groove, and rotatably disposing the roller within the housing and positioning the roller such that a portion of the outer surface faces the second bottom of the container;
    providing a precursor and placing the precursor into the container;
    providing a plurality of beads and placing the beads into the container such that the beads are coated with the precursor; and rotating the roller.

15. The method as in claim 14 wherein the precursor is in either powder or crystal form.

16. The method as in claim 14 wherein the beads are made from stainless steel.

17. The method as in claim 14 wherein the beads are made from an inert material that does not react with the precursor.

18. The method as in claim 14 wherein the roller is rotated by providing a motor and operatively connecting the motor to the roller.

19. The method as in claim 14 further comprising the step of providing an evaporator having a open third top and a third bottom and attaching the third top to the first bottom of the housing.

20. The method as in claim 19 further comprising the steps of:
    providing a first inlet tube and attaching the first inlet tube to the evaporator; and
    introducing a first gas into the evaporator via the first inlet tube.

21. The method as in claim 19 wherein a first screen is disposed within the evaporator.

22. The method as in claim 21 wherein a second screen is disposed within the evaporator downstream of the first screen.

23. The method as in claim 19 further comprising the steps of:
    providing a reactor; and
    providing an outlet tube that extends between the third bottom of the evaporator and the reactor for fluid flow connecting the evaporator with the reactor.

24. The method as in claim 23 further comprising the steps of:
    providing a second inlet tube and attaching the second inlet tube to the outlet tube; and
    introducing a second gas into the outlet tube via the second inlet tube.

25. The method as in claim 23 further comprising the steps of:
    providing a substrate holder and disposing the holder within the reactor; and
    providing a thermocouple and attaching the thermocouple to the holder.

* * * * *